(12) United States Patent
Archer et al.

(10) Patent No.: US 10,529,945 B2
(45) Date of Patent: Jan. 7, 2020

(54) ORGANIC LIGHT EMITTING DEVICE

(71) Applicants: Cambridge Display Technology Limited, Godmanchester (GB); Sumitomo Chemical Company Limited, Tokyo (JP)

(72) Inventors: Robert Archer, Godmanchester (GB); Simon King, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 301 days.

(21) Appl. No.: 15/515,734

(22) PCT Filed: Sep. 25, 2015

(86) PCT No.: PCT/GB2015/052792
§ 371 (c)(1),
(2) Date: Mar. 30, 2017

(87) PCT Pub. No.: WO2016/051144
PCT Pub. Date: Apr. 7, 2016

(65) Prior Publication Data
US 2017/0301881 A1    Oct. 19, 2017

(30) Foreign Application Priority Data
Sep. 30, 2014 (GB) .................... 1417250.6

(51) Int. Cl.
| H01L 51/50 | (2006.01) |
| H01L 51/52 | (2006.01) |
| H01L 51/00 | (2006.01) |
| C08G 61/12 | (2006.01) |

(52) U.S. Cl.
CPC .......... *H01L 51/5234* (2013.01); *C08G 61/12* (2013.01); *H01L 51/0035* (2013.01);
(Continued)

(58) Field of Classification Search
None
See application file for complete search history.

(56) References Cited

U.S. PATENT DOCUMENTS

| 2008/0061685 A1* | 3/2008 | Chesterfield ........ H01L 51/0035 313/504 |
| 2013/0075714 A1 | 3/2013 | Zuberi et al. |

(Continued)

FOREIGN PATENT DOCUMENTS

| EP | 1 892 776 A2 | 2/2008 |
| EP | 2 203 944 A1 | 7/2010 |

(Continued)

OTHER PUBLICATIONS

Combined Search and Examination Report dated Aug. 3, 2015 for Application No. GB 1417250.6.
(Continued)

*Primary Examiner* — Gregory D Clark
(74) *Attorney, Agent, or Firm* — Wolf, Greenfield & Sacks, P.C.

(57) ABSTRACT

An organic light-emitting device (100) comprising an anode (103); a cathode (109); a light-emitting layer (107) between the anode and the cathode; a first hole-transporting layer (105A) comprising a first conjugated hole-transporting polymer between the anode and the light-emitting layer; and a second hole-transporting layer (105B) comprising a second conjugated hole-transporting polymer between the first hole-transporting layer and the light-emitting layer, wherein a lowest excited state energy level of the first hole-transporting polymer is lower than the lowest excited state energy of the second hole-transporting polymer.

11 Claims, 5 Drawing Sheets

(52) U.S. Cl.
CPC ...... *H01L 51/0043* (2013.01); *H01L 51/5004* (2013.01); *H01L 51/5221* (2013.01); *C08G 2261/124* (2013.01); *C08G 2261/135* (2013.01); *C08G 2261/148* (2013.01); *C08G 2261/1412* (2013.01); *C08G 2261/1624* (2013.01); *C08G 2261/3142* (2013.01); *C08G 2261/3162* (2013.01); *C08G 2261/411* (2013.01); *C08G 2261/512* (2013.01); *C08G 2261/76* (2013.01); *C08G 2261/95* (2013.01); *H01L 51/0003* (2013.01); *H01L 51/5064* (2013.01); *H01L 51/5231* (2013.01); *H01L 2251/55* (2013.01)

(56) References Cited

U.S. PATENT DOCUMENTS

2013/0241400 A1  9/2013  Kwong et al.
2015/0115231 A1  4/2015  Lee et al.
2015/0295201 A1* 10/2015 Wehlus ............... H01L 51/5212
                                                    257/40

FOREIGN PATENT DOCUMENTS

| EP | 2 811 524 A1 | 12/2014 |
|---|---|---|
| JP | 2004-139819 A | 5/2004 |
| WO | WO 02/43447 A2 | 5/2002 |
| WO | WO 2009/053089 A1 | 4/2009 |
| WO | WO 2013/022419 A1 | 2/2013 |
| WO | WO 2013/164647 A2 | 11/2013 |
| WO | WO 2014/199567 A1 | 12/2014 |

OTHER PUBLICATIONS

International Search Report and Written Opinion dated Jan. 18, 2016 for Application No. PCT/GB2015/052792.

* cited by examiner

ORGANIC LIGHT EMITTING DEVICE

RELATED APPLICATIONS

This application is a national stage filing under 35 U.S.C. § 371 of International PCT application, PCT/GB2015/052792, filed Sep. 25, 2015, which claims priority to United Kingdom patent application, GB 1417250.6, filed Sep. 30, 2014, each of which is incorporated herein by reference in its entirety.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, a light-emitting dopant in which light is emitted via decay of a triplet exciton).

WO 2005/059921 discloses an organic light-emitting device comprising a hole-transporting layer and an electroluminescent layer comprising a host material and a phosphorescent material. High triplet energy level hole-transporting materials are disclosed in order to prevent quenching of phosphorescence.

WO 2010/119273 discloses an organic electroluminescent device having first and second electroluminescent layers including an electroluminescent layer comprising a hole-transporting material and an electroluminescent electron trapping material.

WO 2012/052713 discloses an organic light-emitting device having a charge-transporting layer doped with a light-emitting dopant and a light-emitting layer wherein the colour of light emitted from the device is wherein the x-coordinate value and/or the y-coordinate value of CIE(x,y) coordinates of light emitted from the device is no more than 0.1, and preferably no more than 0.05, from the respective x- or y-coordinate value of a control device in which the charge transporting layer is not doped with a light-emitting dopant.

WO 02/43447 discloses a device having a hole-transporting layer formed of a conjugated polymer and a layer consisting of an electroluminescent material. A buffer layer may be provided between the anode and the conjugated polymer layer.

WO 2008/024380 discloses a device having an anode; a buffer layer; a first hole transport layer; a second hole transport layer; and a photoactive layer comprising an anthracene derivative.

JP 2004/139819 discloses an organic electroluminescent device having a first hole-transporting layer, a second hole-transporting layer and a light-emitting layer containing a host and a phosphorescent dopant.

SUMMARY OF THE INVENTION

In a first aspect the invention provides an organic light-emitting device comprising an anode; a cathode; a light-emitting layer between the anode and the cathode; a first hole-transporting layer comprising a first conjugated hole-transporting polymer between the anode and the light-emitting layer; and a second hole-transporting layer comprising a second conjugated hole-transporting polymer between the first hole-transporting layer and the light-emitting layer, wherein a lowest excited state energy level of the first hole-transporting polymer is lower than the lowest excited state energy of the second hole-transporting polymer.

In a second aspect the invention provides a method of forming an organic light-emitting device according to the first aspect comprising the steps of forming the first hole-transporting layer over the anode; forming the second hole-transporting layer over the first hole-transporting layer; forming the light-emitting layer over the second hole-transporting layer; and forming the cathode over the light-emitting layer.

DESCRIPTION OF THE DRAWINGS

The invention will now be described in more detail with reference to the drawings in which.

DETAILED DESCRIPTION OF THE INVENTION

Figure 1:
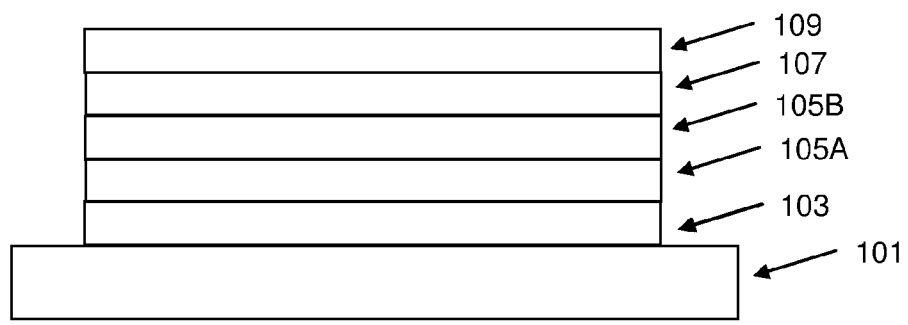
FIG. 1 illustrates schematically an OLED according to an embodiment of the invention.

FIG. 1 illustrates an OLED 100 having a substrate 101, an anode 103, a first hole-transporting layer 105A, a second hole-transporting layer 105B, a light-emitting layer 107 and a cathode 109.

Each of the hole-transporting layers 105A, 105B contains a hole-transporting material suitable for transporting holes from the anode 103 to the light-emitting layer 107. In operation, light is emitted from the light-emitting layer 107. One or both of the hole-transporting layers 105A and 105B may contain a light-emitting material such that, in operation, one or both of these layers emit light in addition to light-emitting layer 107.

Light-emitting layer 107 contains at least one light-emitting material selected from fluorescent and phosphorescent light-emitting materials.

Second hole-transporting layer 105B is adjacent to light-emitting layer 107 and contains a second hole-transporting polymer having an excited state energy level that is less than 0.1 eV lower than, preferably the same as or higher than, the excited state energy level of any of the light-emitting materials of layer 107. If the light-emitting layer 107 contains one or more fluorescent light-emitting materials then the second hole-transporting polymer has a lowest singlet excited state ($S_1$) energy level that is less than 0.1 eV lower than that of the fluorescent light-emitting material having the highest $S_1$ energy level. If the light-emitting layer 107 contains one or more phosphorescent light-emitting materials then the second hole-transporting polymer has a lowest triplet excited state ($T_1$) energy level that is less than 0.1 eV lower than that of the phosphorescent light-emitting material having the highest $T_1$ energy level.

First hole-transporting layer 105A is between the anode and the second hole-transporting layer 105B, and may be adjacent to second hole-transporting layer 105B. First hole-transporting layer 105B contains a first hole-transporting polymer having an excited state energy level that is lower than the corresponding excited state energy level of the second hole-transporting polymer of second hole-transporting layer 105B. The first hole-transporting polymer may have an excited state energy level at least 0.1 eV lower than that of the second hole-transporting polymer, and is optionally in the range of 0.1-0.5 eV lower than that of the second hole-transporting polymer.

If light-emitting layer 107 contains a phosphorescent light-emitting material then the hole-transporting polymer of layer 105A may have a $T_1$ level at least 0.1 eV lower than the $T_1$ excited state energy level of the phosphorescent light-emitting material of layer 107.

The first and second hole-transporting polymers are semi-conducting polymers containing repeat units in the polymer backbone that are conjugated to one another to form a conjugated backbone. The excited state energy levels of the first and second hole-transporting polymers may be controlled by controlling the extent of conjugation of the polymers. Repeat units may be introduced into the polymer backbone to provide a relatively high excited stated energy level by limiting the extent of conjugation along the polymer backbone. Conjugation of the polymer backbone may be limited by providing repeat units that limit the extent of conjugation across the repeat unit or that completely break conjugation across the repeat unit.

The singlet energy level of a material as described anywhere herein may be measured from its fluorescence spectrum.

The triplet energy level of a material as described anywhere herein may be measured from the energy onset of the phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718). The triplet energy level of a phosphorescent material that is phosphorescent at ambient temperature may be measured from its phosphorescence spectrum.

One or more further layers may be provided between the anode 101 and cathode 109, for example a hole-injection layer, one or more further hole-transporting layers, electron transporting layers, hole blocking layers and electron blocking layers. Preferably, a hole-injection layer is provided between the anode and the first and second hole-transporting layers. Where present, a hole-injection layer is preferably adjacent to the first hole-transporting layer 105A.

In embodiments of the invention, substantially all light is emitted from light-emitting layer 107 only. In other embodiments of the invention, one or more other layers of the device may emit light. The further light-emitting layer or layers may be a charge-transporting layer containing a fluorescent or phosphorescent light-emitting material that emits light when the device is in use. One of the first hole-transporting layer 105A and the second hole-transporting layer 105B may contain a fluorescent or phosphorescent light-emitting material.

The OLED may be a white-emitting OLED. A white-emitting OLED may contain a single, white-emitting layer 107 or emission from light-emitting layer 107 may combine with emission from one or more further layers of the device to produce white light. White light may be produced from a combination of red, green and blue light-emitting materials provided in a single light-emitting layer or distributed within two or more layers. In a preferred arrangement, light-emitting layer 107 contains green and blue light-emitting materials and one of the first and second hole-transporting layers 105A and 105B, preferably second hole transporting layer 105B, contains a red light-emitting material.

White-emitting OLEDs as described herein may have a CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-6000K.

A red light-emitting material may have a photoluminescence spectrum with a peak in the range of about more than 550 up to about 700 nm, optionally in the range of about more than 560 nm or more than 580 nm up to about 630 nm or 650 nm.

A green light-emitting material may have a photoluminescence spectrum with a peak in the range of about more than 490 nm up to about 560 nm, optionally from about 500 nm, 510 nm or 520 nm up to about 560 nm.

A blue light-emitting material may have a photoluminescence spectrum with a peak in the range of up to about 490 nm, optionally about 450-490 nm Hole-transporting Polymers Hole transporting polymers as described herein may have a electron affinity of −2.9 eV or lower (i.e. closer to vacuum level) and an ionisation potential of −5.8 eV or lower, preferably −5.7 eV or lower. Electron affinites and ionization potentials as described herein are as measured by cyclic voltammetry.

Hole-transporting polymers include conjugated and non-conjugated polymers. A conjugated hole-transporting polymer may comprise repeat units of formula (III):

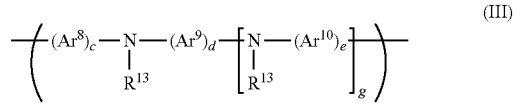

wherein $Ar^8$, $Ar^9$ and $Ar^{11}$ in each occurrence are independently selected from substituted or unsubstituted aryl or heteroaryl, g is 0, 1 or 2, preferably 0 or 1, $R^{13}$ independently in each occurrence is H or a substituent, preferably a substituent, and c, d and e are each independently 1, 2 or 3.

$R^{13}$, which may be the same or different in each occurrence when g is 1 or 2, is preferably selected from the group consisting of alkyl, for example $C_{1-20}$ alkyl, $Ar^{11}$, a branched or linear chain of $Ar^{11}$ groups, or a crosslinkable unit that is bound directly to the N atom of formula (III) or spaced apart therefrom by a spacer group, wherein $Ar^{11}$ in each occurrence is independently optionally substituted aryl or heteroaryl. Exemplary spacer groups are $C_{1-20}$ alkyl, phenyl and phenyl-$C_{1-20}$ alkyl.

Any two aromatic or heteroaromatic groups selected from $Ar^8$, $Ar^9$, and, if present, $Ar^{10}$ and $Ar^{11}$ directly bound to the same N atom may be linked by a direct bond or a divalent linking atom or group to another of $Ar^8$, $Ar^9$, $Ar^{10}$ and $Ar^{11}$. Preferred divalent linking atoms and groups include O, S; substituted N; and substituted C.

$Ar^8$ is preferably $C_{6-20}$ aryl, more preferably phenyl, that may be unsubstituted or substituted with one or more substituents.

In the case where g=0, $Ar^9$ is preferably $C_{6-20}$ aryl, more preferably phenyl, that may be unsubstituted or substituted with one or more substituents.

In the case where g=1, $Ar^9$ is preferably $C_{6-20}$ aryl, more preferably phenyl or a polycyclic aromatic group, for example naphthalene, perylene, anthracene or fluorene, that may be unsubstituted or substituted with one or more substituents.

$R^{13}$ is preferably $Ar^{11}$ or a branched or linear chain of $Ar^{11}$ groups. $Ar^{11}$ in each occurrence is preferably phenyl that may be unsubstituted or substituted with one or more substituents.

Exemplary groups $R^{13}$ include the following, each of which may be unsubstituted or substituted with one or more substituents, and wherein * represents a point of attachment to N:

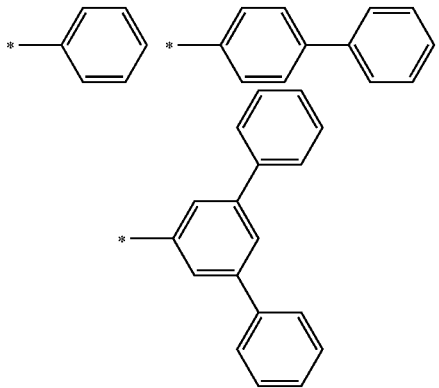

c, d and e are preferably each 1.

$Ar^8$, $Ar^9$, and, if present, $A^{10}$ and $Ar^{11}$ are each independently unsubstituted or substituted with one or more, optionally 1, 2, 3 or 4, substituents. Exemplary substituents may be selected from:

substituted or unsubstituted alkyl, optionally $C_{1-20}$ alkyl, wherein one or more non-adjacent C atoms may be replaced with optionally substituted aryl or heteroaryl (preferably phenyl), O, S, C=O or —COO— and one or more H atoms may be replaced with F; and a crosslinkable group attached directly to or forming part of $Ar^8$, $Ar^9$, $A^{10}$ or $Ar^{11}$ or spaced apart therefrom by a spacer group, for example a group comprising a double bond such and a vinyl or acrylate group, or a benzocyclobutane group.

Preferred substituents of $Ar^8$, $Ar^9$, and, if present, $Ar^{10}$ and $Ar^{11}$ are $C_{1-40}$ hydrocarbyl, preferably $C_{1-20}$ alkyl or a hydrocarbyl crosslinking group.

Preferred repeat units of formula (III) include units of formulae 1-3:

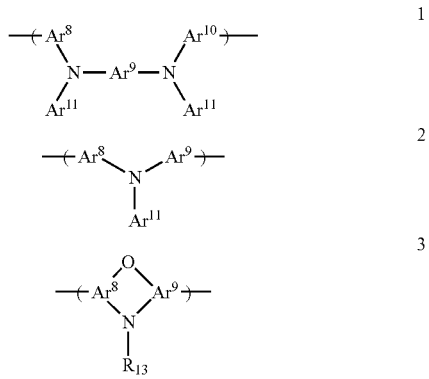

Preferably, $Ar^8$, $Ar^{10}$ and $Ar^{11}$ of repeat units of formula 1 are phenyl and $Ar^9$ is phenyl or a polycyclic aromatic group.

Preferably, $Ar^8$, $Ar^9$ and $Ar^{11}$ of repeat units of formulae 2 and 3 are phenyl.

Preferably, $Ar^8$ and $Ar^9$ of repeat units of formula 3 are phenyl and $R^{11}$ is phenyl or a branched or linear chain of phenyl groups.

A hole-transporting polymer comprising repeat units of formula (III) may be a homopolymer or a copolymer containing repeat units of formula (III) and one or more co-repeat units.

In the case of a copolymer, repeat units of formula (III) may be provided in a molar amount in the range of about 10 mol % up to about 95 mol %, optionally about 10-75 mol % or about 10-50 mol %.

Exemplary co-repeat units include arylene repeat units that may be unsubstituted or substituted with one or more substituents, for example one or more $C_{1-40}$ hydrocarbyl groups.

Exemplary arylene co-repeat units include 1,2-, 1,3- and 1,4-phenylene repeat units, 3,6- and 2,7-linked fluorene repeat units, indenofluorene, 1,4-linked naphthalene; 2,6-linked naphthalene, 9,10-linked anthracene; 2,6-linked anthracene; phenanthrene, for example 2,7-linked phenanthrene repeat units, each of which may be unsubstituted or substituted with one or more substituents, for example one or more $C_{1-40}$ hydrocarbyl substituents.

Linking positions and/or substituents of arylene co-repeat units may be used to control the extent of conjugation of a hole-transporting polymer.

Substituents may be provided adjacent to one or both linking positions of an arylene co-repeat unit to create steric hindrance with adjacent repeat units, resulting in twisting of the arylene co-repeat unit out of the plane of the adjacent repeat unit.

Arylene repeat units are optionally provided in an amount in the range of 1-50 mol %.

A twisting repeat unit may have formula (I):

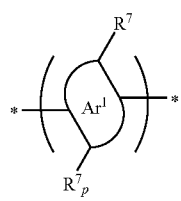

(I)

wherein $Ar^1$ is an arylene group; $R^7$ in each occurrence is a substituent; and p is 0 or 1. The one or two substituents $R^7$ may be the only substituents of repeat units of formula (I), or one or more further substituents may be present, optionally one or more $C_{1-40}$ hydrocarbyl groups.

The one or two substituents $R^7$ adjacent to the linking positions of formula (I) create steric hindrance with one or both repeat units adjacent to the repeat unit of formula (I).

Each $R^7$ may independently be selected from the group consisting of:
  alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
  aryl and heteroaryl groups that may be unsubstituted or substituted with one or more substituents, preferably phenyl substituted with one or more $C_{1-20}$ alkyl groups;
  a linear or branched chain of aryl or heteroaryl groups, each of which groups may independently be substituted, for example a group of formula —$(Ar^7)_r$— wherein each $Ar^7$ is independently an aryl or heteroaryl group and r is at least 2, preferably a branched or linear chain of phenyl groups each of which may be unsubstituted or substituted with one or more $C_{1-20}$ alkyl groups; and
  a crosslinkable-group, for example a group comprising a double bond such and a vinyl or acrylate group, or a benzocyclobutane group.

In the case where $R^7$ comprises an aryl or heteroaryl group, or a linear or branched chain of aryl or heteroaryl groups, the or each aryl or heteroaryl group may be substituted with one or more substituents $R^8$ selected from the group consisting of:
  alkyl, for example $C_{1-20}$ alkyl, wherein one or more non-adjacent C atoms may be replaced with O, S, substituted N, C=O and —COO— and one or more H atoms of the alkyl group may be replaced with F;
  $NR^9_2$, $OR^9$, $SR^9$, $SiR^9_3$ and
  fluorine, nitro and cyano;
wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^6$— wherein $R^6$ is a substituent and is optionally in each occurrence a $C_{1-40}$ hydrocarbyl group, optionally a $C_{1-20}$ alkyl group.

Preferably, each $R^7$, where present, is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

One preferred class of arylene repeat units is phenylene repeat units, such as phenylene repeat units of formula (VI):

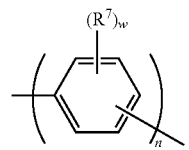

(VI)

wherein w in each occurrence is independently 0, 1, 2, 3 or 4, optionally 1 or 2; n is 1, 2 or 3; and $R^7$ independently in each occurrence is a substituent as described above.

If n is 1 then exemplary repeat units of formula (VI) include the following:

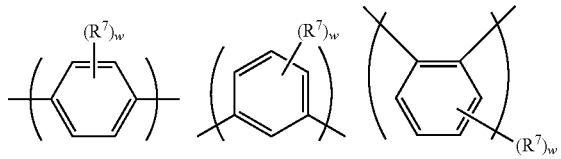

A particularly preferred repeat unit of formula (VI) has formula (VIa):

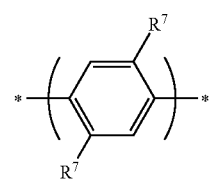

(VIa)

Substituents $R^7$ of formula (VIa) are adjacent to linking positions of the repeat unit, which may cause steric hindrance between the repeat unit of formula (VIa) and adjacent repeat units, resulting in the repeat unit of formula (VIa) twisting out of plane relative to one or both adjacent repeat units.

Exemplary repeat units where n is 2 or 3 include the following:

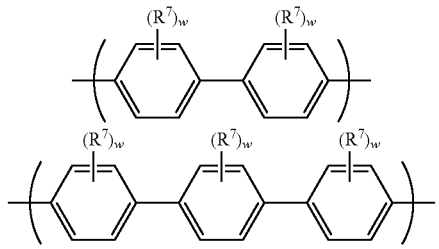

A preferred repeat unit has formula (VIb):

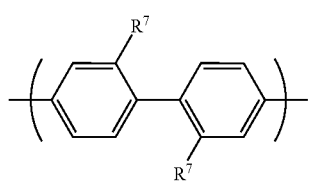

(VIb)

The two $R^7$ groups of formula (VIb) may cause steric hindrance between the phenyl rings they are bound to, resulting in twisting of the two phenyl rings relative to one another.

A further class of arylene repeat units is optionally substituted fluorene repeat units, such as repeat units of formula (VII):

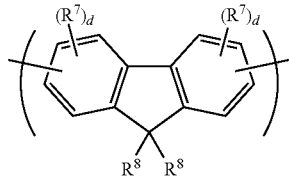

(VII)

wherein $R^8$ in each occurrence is the same or different and is a substituent wherein the two groups $R^8$ may be linked to form a ring; $R^7$ is a substituent as described above; and d is 0, 1, 2 or 3.

Each $R^8$ may independently be selected from the group consisting of:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups;
- a linear or branched chain of aryl or heteroaryl groups, each of which groups may independently be substituted, for example a group of formula —$(Ar^7)_r$ wherein each $Ar^7$ is independently an aryl or heteroaryl group and r is at least 2, optionally 2 or 3, preferably a branched or linear chain of phenyl groups each of which may be unsubstituted or substituted with one or more $C_{1-20}$ alkyl groups; and
- a crosslinkable-group, for example a group comprising a double bond such and a vinyl or acrylate group, or a benzocyclobutane group.

Preferably, each $R^8$ is independently a $C_{1-40}$ hydrocarbyl group.

Substituted N, where present, may be —$NR^6$— wherein $R^6$ is as described above.

The aromatic carbon atoms of the fluorene repeat unit may be unsubstituted, or may be substituted with one or more substituents $R^7$ as described with reference to Formula (VI).

Exemplary substituents $R^7$ are alkyl, for example $C_{1-20}$ alkyl, wherein one or more non-adjacent C atoms may be replaced with O, S, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

The extent of conjugation of repeat units of formula (VII) to aryl or heteroaryl groups of adjacent repeat units in the polymer backbone may be controlled by (a) linking the repeat unit through the 3- and/or 6-positions to limit the extent of conjugation across the repeat unit, and/or (b) substituting the repeat unit with one or more substituents $R^8$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

The repeat unit of formula (VII) may be a 2,7-linked repeat unit of formula (VIIa):

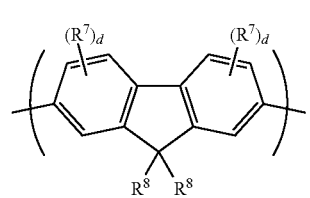

(VIIa)

A relatively high degree of conjugation across the repeat unit of formula (VIIa) may be provided in the case where each d=0, or where any substituent R7 is not present at a position adjacent to the linking 2- or 7-positions of formula (VIIa).

A relatively low degree of conjugation across the repeat unit of formula (VIIa) may be provided in the case where at least one d is at least 1, and where at least one substituent $R^7$ is present at a position adjacent to the linking 2- or 7-positions of formula (VIIa). Optionally, each d is 1 and the 3- and/or 6-position of the repeat unit of formula (VIIa) is substituted with a substituent $R^7$ to provide a relatively low degree of conjugation across the repeat unit.

The repeat unit of formula (VII) may be a 3,6-linked repeat unit of formula (VIIb)

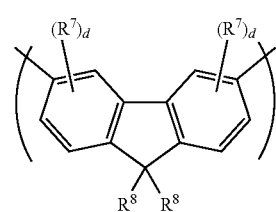

(VIIb)

The extent of conjugation across a repeat unit of formula (VIIb) may be relatively low as compared to a corresponding repeat unit of formula (VIIa).

Another exemplary arylene repeat unit has formula (VIII):

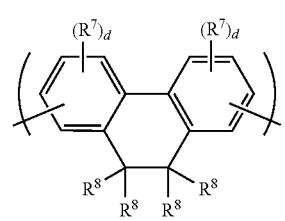

(VIII)

wherein $R^7$, $R^8$ and d are as described with reference to formula (VI) and (VII) above. Any of the $R^7$ groups may be linked to any other of the $R^7$ groups to form a ring. The ring so formed may be unsubstituted or may be substituted with one or more substituents, optionally one or more $C_{1-20}$ alkyl groups.

Repeat units of formula (VIII) may have formula (VIIIa) or (VIIIb):

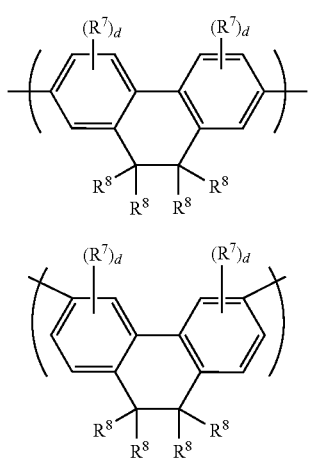

The one or more co-repeat units may include a conjugation-breaking repeat unit, which is a repeat unit that does not provide any conjugation path between repeat units adjacent to the conjugation-breaking repeat unit.

Exemplary conjugation-breaking co-repeat units include co-repeat units of formula (II):

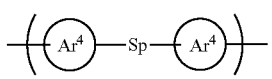

wherein:

$Ar^4$ in each occurrence independently represents an aryl or heteroaryl group that may be unsubstituted or substituted with one or more substituents; and Sp represents a spacer group comprising at least one carbon or silicon atom.

Preferably, the spacer group Sp includes at least one $sp^3$-hybridised carbon atom separating the $Ar^4$ groups.

Preferably $Ar^4$ is an aryl group and the $Ar^4$ groups may be the same or different. More preferably each $Ar^4$ is phenyl.

Each $Ar^4$ may independently be unsubstituted or may be substituted with 1, 2, 3 or 4 substituents. The one or more substituents may be selected from:

$C_{1-20}$ alkyl wherein one or more non-adjacent C atoms of the alkyl group may be replaced by O, S or COO, C=O, $NR^6$ or $SiR^6_2$ and one or more H atoms of the $C_{1-20}$ alkyl group may be replaced by F wherein $R^6$ is a substituent and is optionally in each occurrence a $C_{1-40}$ hydrocarbyl group, optionally a $C_{1-20}$ alkyl group; and aryl or heteroaryl, optionally phenyl, that may be unsubstituted or substituted with one or more $C_{1-20}$ alkyl groups.

Preferred substituents of $Ar^4$ are $C_{1-20}$ alkyl groups, which may be the same or different in each occurrence.

Exemplary groups Sp include a $C_{1-20}$ alkyl chain wherein one or more non-adjacent C atoms of the chain may be replaced with O, S, —NR—, —$SiR^6_2$—, —C(=O)— or —COO— and wherein $R^6$ in each occurrence is a substituent and is optionally in each occurrence a $C_{1-40}$ hydrocarbyl group, optionally a $C_{1-20}$ alkyl group.

Exemplary repeat units of formula (II) include the following, wherein R in each occurrence is H or $C_{1-5}$ alkyl:

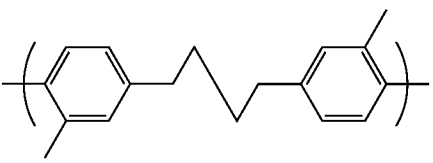
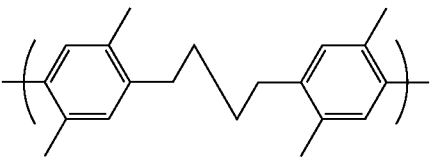
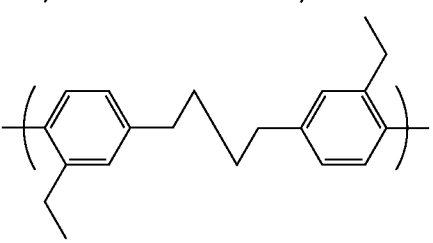
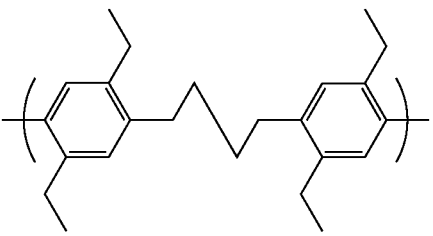
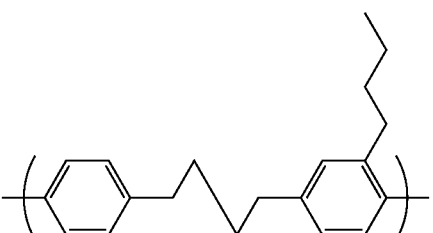
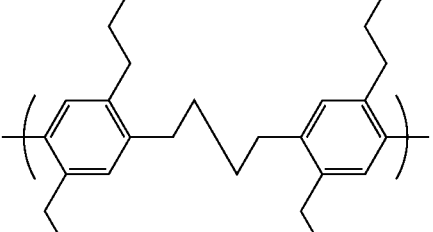

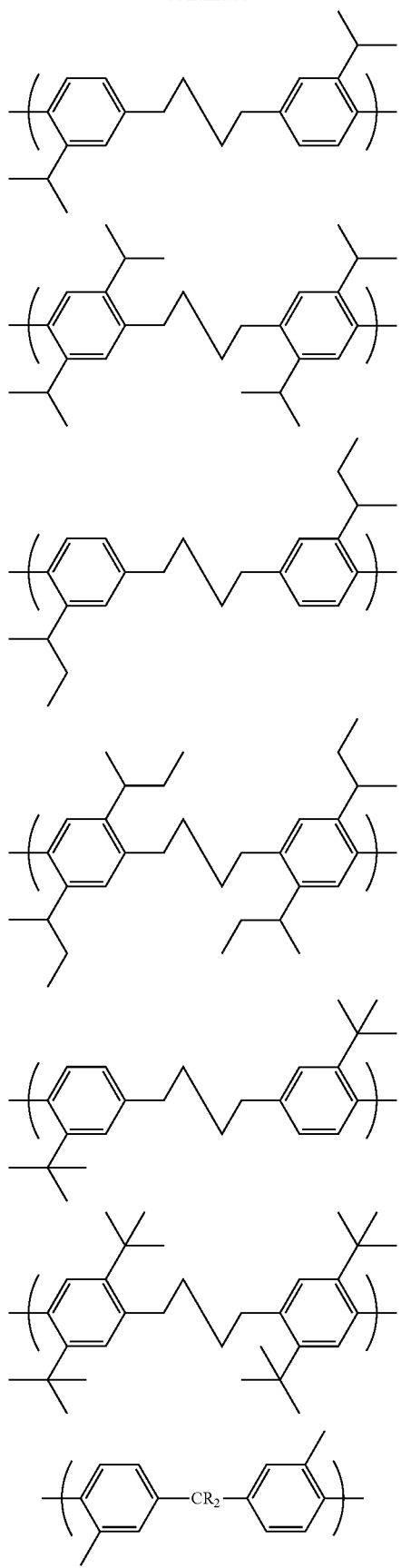
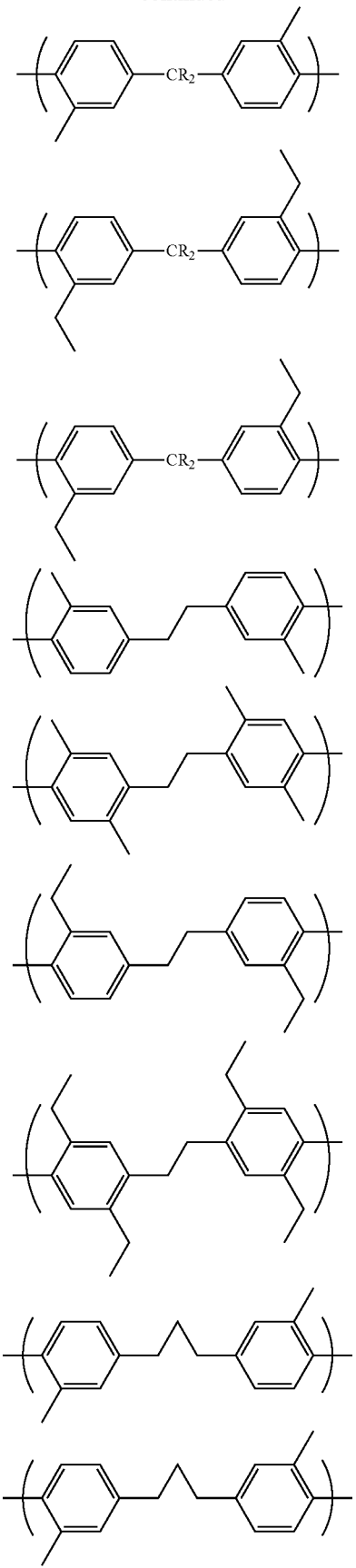

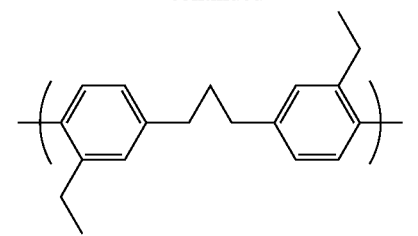
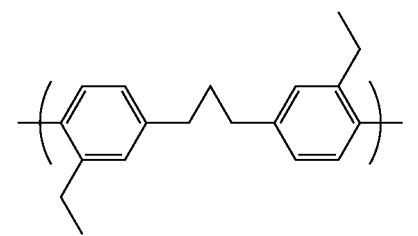
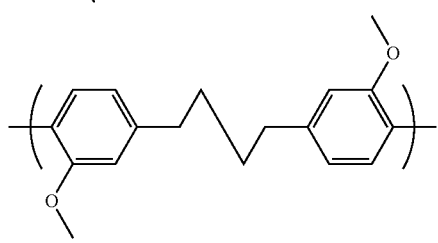
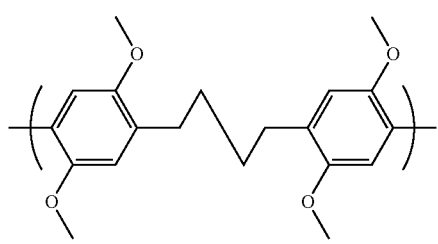
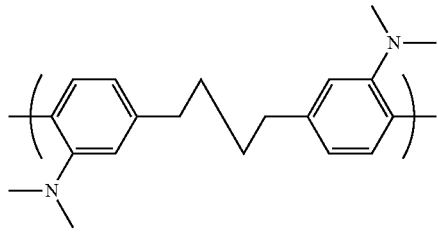
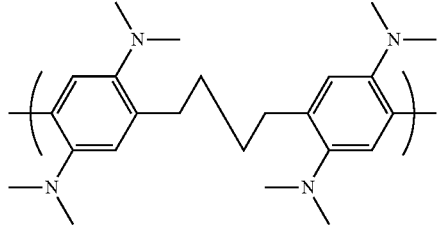
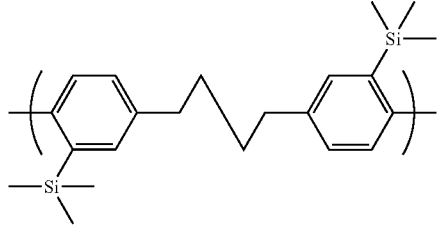
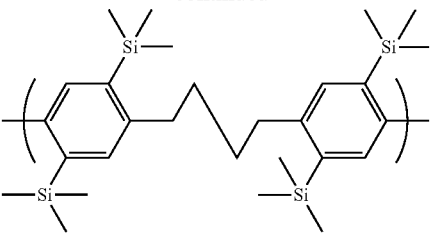
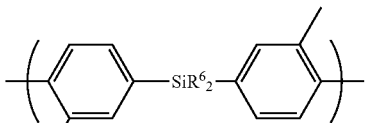
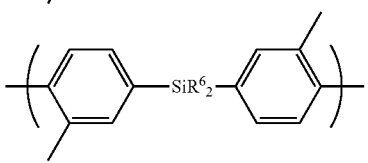
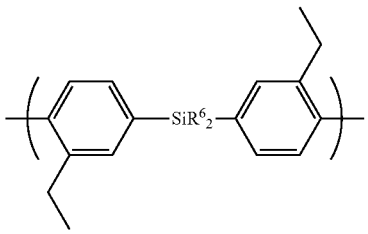
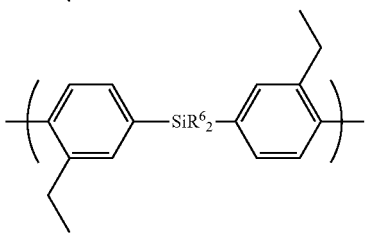
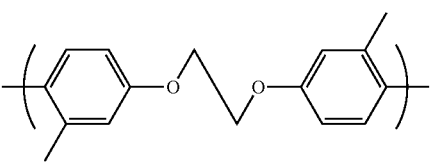
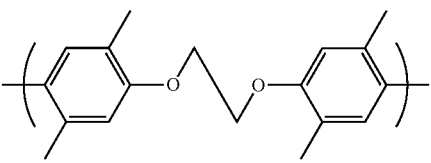
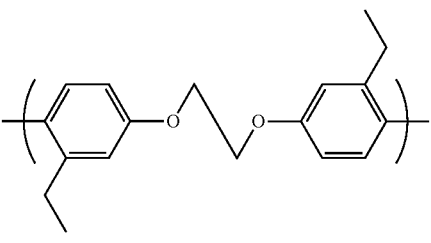

-continued

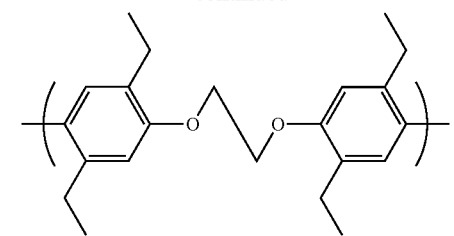

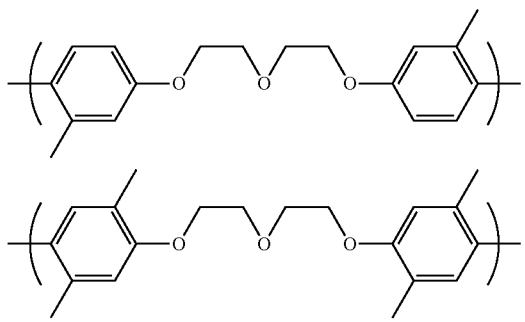

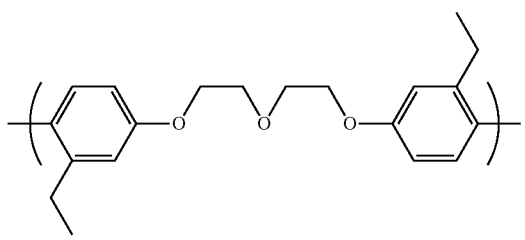

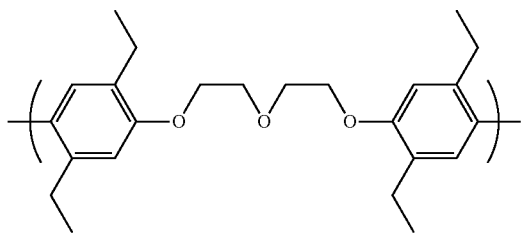

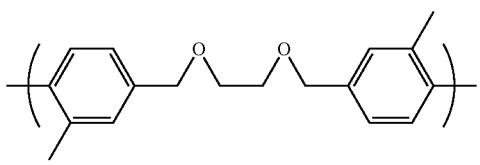

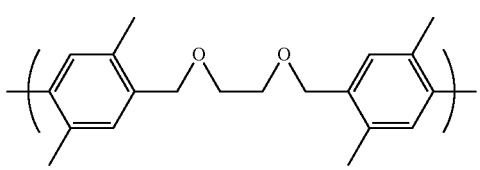

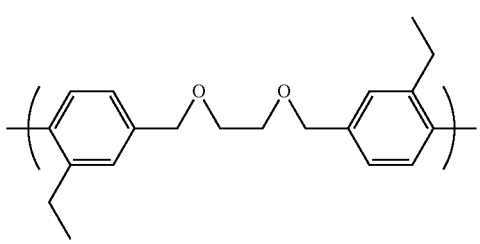

-continued

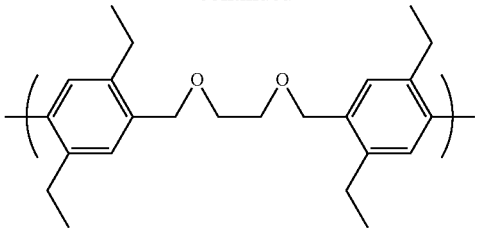

The hole-transporting polymer may contain one, two or more different repeat units of formula (III).

The hole-transporting polymer may contain crosslinkable groups that may be crosslinked following deposition of the hole-transporting polymer to form an insoluble, crosslinked hole-transporting layer prior to formation of the second light-emitting layer.

Crosslinkable groups may be provided as substituents of any repeat units of the polymer, for example any of repeat units (I), (II), (III), (VI), (VII) or (VIII) that may be present in the hole-transporting polymer.

Polymers as described herein suitably have a polystyrene-equivalent number-average molecular weight (Mn) measured by gel permeation chromatography in the range of about $1 \times 10^3$ to $1 \times 10^8$, and preferably $1 \times 10^3$ to $5 \times 10^6$. The polystyrene-equivalent weight-average molecular weight (Mw) of the polymers described herein may be $1 \times 10^3$ to $1 \times 10^8$, and preferably $1 \times 10^4$ to $1 \times 10^7$.

The hole-transporting polymers as described anywhere herein are suitably amorphous polymers.

Light-emitting Material

Light-emitting materials provided in the light-emitting layer 107 and, if present, in a further layer of the device may be polymeric or non-polymeric light-emitting materials, and may be fluorescent or phosphorescent light-emitting materials.

A phosphorescent light-emitting layer 107 may contain a host material in addition to at least one phosphorescent light-emitting material. The host material may be a non-polymeric or polymeric material. The host material preferably has a triplet energy level that is the same as or higher than the triplet energy level or levels of the one or more phosphorescent materials.

The host material may be an electron-transporting material to provide for efficient transport of electrons from the cathode into the light-emitting layer 107, either directly if the light-emitting layer 107 is in direct contact with the cathode or, if present, via one or more intervening electron-transporting layers. The host material may have a LUMO level in the range of about −2.8 to −1.6 eV.

Host polymers include polymers having a non-conjugated backbone with charge-transporting groups pendant from the polymer backbone, and polymers having a conjugated backbone in which adjacent repeat units of the polymer backbone are conjugated together. A conjugated host polymer may comprise, without limitation, repeat units selected from optionally substituted arylene or heteroarylene repeat units including any of the arylene (I), (VI), (VII) and (VIII) described above; conjugation-breaking repeat units of formula (II) as described above; and amine repeat units of formula (III) as described above.

The host polymer may contain triazine-containing repeat units. Exemplary triazine-containing repeat units have formula (IV):

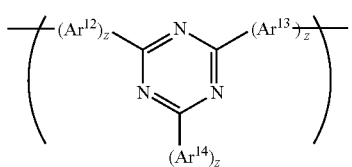

(IV)

wherein $Ar^{12}$, $Ar^{13}$ and $Ar^{14}$ are independently selected from substituted or unsubstituted aryl or heteroaryl, and z in each occurrence is independently at least 1, optionally 1, 2 or 3, preferably 1.

Any of $Ar^{12}$, $Ar^{13}$ and $Ar^{14}$ may be substituted with one or more substituents. Exemplary substituents are substituents $R^{10}$, wherein each $R^{10}$ may independently be selected from the group consisting of:
- substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and
- a crosslinkable group attached directly to $Ar^{12}$, $Ar^{13}$ and $Ar^{14}$ or spaced apart therefrom by a spacer group, for example a group comprising a double bond such and a vinyl or acrylate group, or a benzocyclobutane group.

Substituted N, where present, may be $-NR^6-$ wherein $R^6$ is a substituent as described above.

Preferably, $Ar^{12}$, $Ar^{13}$ and $Ar^{14}$ of formula (VIII) are each phenyl, each phenyl independently being unsubstituted or substituted with one or more $C_{1-20}$ alkyl groups.

$Ar^{14}$ of formula (IV) is preferably phenyl, and is optionally substituted with one or more $C_{1-20}$ alkyl groups or a crosslinkable unit.

A particularly preferred repeat unit of formula (IV) has formula (IVa), which may be unsubstituted or substituted with one or more substituents $R^{10}$, preferably one or more $C_{1-20}$ alkyl groups:

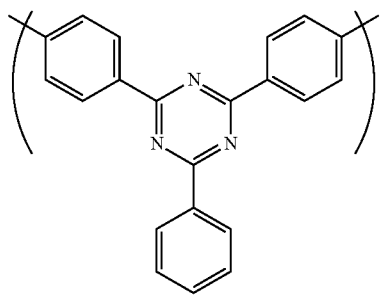

(IVa)

Phosphorescent light-emitting materials are preferably phosphorescent transition metal complexes.

Exemplary phosphorescent transition metal complexes have formula (IX):

$ML^1{}_q L^2{}_r L^3{}_s$ (IX)

wherein M is a metal; each of $L^1$, $L^2$ and $L^3$ is a coordinating group; q is a positive integer; r and s are each independently 0 or a positive integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$. Preferably, a, b and c are each 1 or 2, more preferably 2 (bidentate ligand). In preferred embodiments, q is 2, r is 0 or 1 and s is 0, or q is 3 and r and s are each 0.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (X):

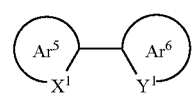

(X)

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and $Ar^6$ is a single ring or fused aromatic, for example phenyl or naphthyl.

To achieve red emission, $Ar^5$ may be selected from phenyl, fluorene, naphthyl and $Ar^6$ are selected from quinoline, isoquinoline, thiophene and benzothiophene.

To achieve green emission, $Ar^5$ may be selected from phenyl or fluorene and $Ar^6$ may be pyridine.

To achieve blue emission, $Ar^5$ may be selected from phenyl and $Ar^6$ may be selected from imidazole, pyrazole, triazole and tetrazole.

Examples of bidentate ligands are illustrated below:

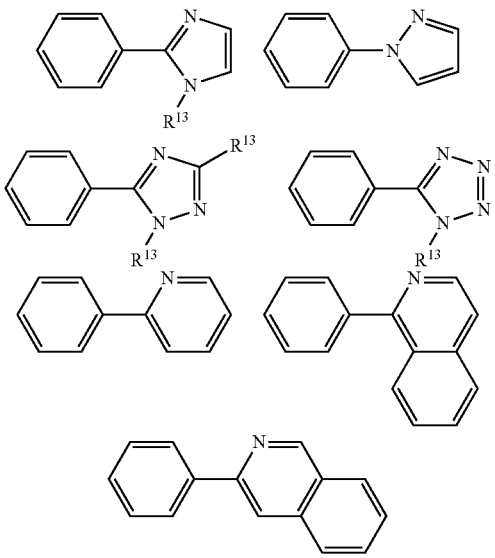

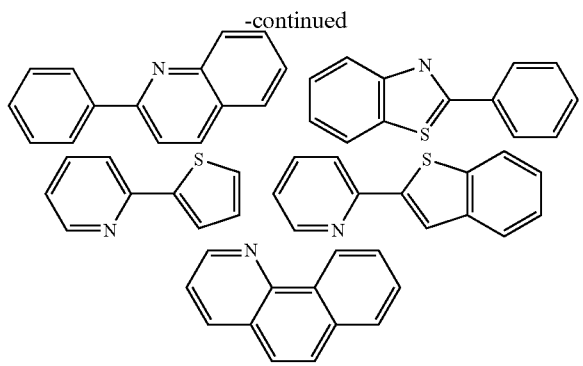

Each of Ar⁵ and Ar⁶ may carry one or more substituents. Two or more of these substituents may be linked to form a ring, for example an aromatic ring.

Other ligands suitable for use with d-block elements include diketonates, in particular acetylacetonate (acac), tetrakis-(pyrazol-1-yl)borate, 2-carboxypyridyl, triarylphosphines and pyridine, each of which may be substituted.

Exemplary substituents include groups $R^7$ as described above with reference to Formula (I). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; charge transporting groups, for example carbazole which may be used to assist hole transport to the complex when used as an emissive material, for example as disclosed in WO 02/81448; and dendrons which may be used to obtain or enhance solution processability of the metal complex, for example as disclosed in WO 02/66552. If substituents $R^7$ include a charge-transporting group then the compound of formula (IX) may be used in light-emitting layer 107 without a separate host material.

A light-emitting dendrimer comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XI)

(XI)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIa):

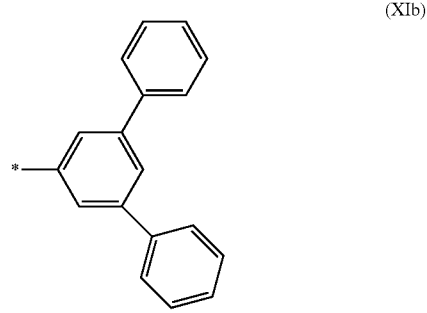
(XIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1$, $G_2$ ... $G_n$ is phenyl, and each phenyl BP, $G_1$, $G_2$ ... $G_{n-1}$ is a 3,5-linked phenyl.

A preferred dendron is a substituted or unsubstituted dendron of formula (XIb):

(XIb)

wherein * represents an attachment point of the dendron to a core.

BP and/or any group G may be substituted with one or more substituents, for example one or more $C_{1-20}$ alkyl or alkoxy groups.

The phosphorescent material may be covalently bound to a host material of or may be mixed with a host material.

If a phosphorescent material is present in a hole-transporting layer then the phosphorescent material may be covalently bound to the hole-transporting polymer of that layer.

The phosphorescent material may be covalently bound to a host polymer or a hole-transporting polymer as a repeat unit in the polymer backbone, as an end-group of the polymer, or as a side-chain of the polymer. If the phosphorescent material is provided as a side-chain then it may be directly bound to a repeat unit in the backbone of the polymer or it may be spaced apart from the polymer backbone by a spacer group. Exemplary spacer groups include $C_{1-20}$ alkyl and aryl-$C_{1-20}$ alkyl, for example phenyl-$C_{1-20}$ alkyl. One or more carbon atoms of an alkyl group of a spacer group may be replaced with O, S, C═O or COO. A phosphorescent material of a hole-transporting layer or the light-emitting layer 107, and optional spacer, may be provided as a substituent of any of repeat units of formulae (I), (II), (III), (IV), (VI), (VII) or (VIII) described above that may be present in a hole-transporting polymer or host polymer.

Covalent binding of the phosphorescent material to a hole-transporting polymer may reduce or avoid washing of the phosphorescent material out of the hole-transporting layer if an overlying layer is deposited from a formulation of the overlying layer's materials in a solvent or solvent mixture.

A phosphorescent material mixed with a host material or hole-transporting polymer may form 0.1-50 weight %, optionally 0.1-20 wt % 5 mol % of the weight of the components of the layer containing the phosphorescent material If the phosphorescent material is covalently bound to a hole-transporting polymer then repeat units comprising the phosphorescent material, or an end unit comprising the phosphorescent material, may form 0.1-20 mol %, optionally 0.1-5 mol % of the polymer.

If two or more phosphorescent materials are provided in the second light emitting layer then the phosphorescent material with the highest triplet energy level is preferably provided in a larger weight percentage than the lower triplet energy level material or materials.

Fluorescent light-emitting materials may be polymeric or non-polymeric materials. Preferred fluorescent light-emitting materials are polymers comprising repeat units of formula (III).

HOMO and LUMO Level Measurement

HOMO and LUMO levels as described anywhere herein may be measured by cyclic voltammetry.

The working electrode potential may be ramped linearly versus time. When cyclic voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/or tertbutyl ammonium hexafluorophosphate solution in acetonitrile, a glassy carbon working electrode where the sample is coated as a film, a platinium counter electrode (donor or acceptor of electrons) and a reference glass electrode no leak Ag/AgCl. Ferrocene is added in the cell at the end of the experiment for calculation purposes.

Measurement of the difference of potential between Ag/AgCl/ferrocene and sample/ferrocene.

Method and Settings:
3 mm diameter glassy carbon working electrode
Ag/AgCl/no leak reference electrode
Pt wire auxiliary electrode
0.1 M tetrabutylammonium hexafluorophosphate in acetonitrile
LUMO=4.8−ferrocene(peak to peak maximum average)+onset Sample: 1 drop of 5 mg/mL in toluene spun at 3000 rpm LUMO (reduction) measurement: A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline. HOMO and LUMO values may be measured at ambient temperature.

Hole Injection Layers

A hole injection layer may be provided between the anode 103 and the first hole-transporting layer 105A. The hole-injection layer may be formed from a conductive organic or inorganic material, and may be formed from a doped, degenerate semiconductor.

Examples of conductive organic materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx, MoOx and RuOx as disclosed in Journal of Physics D: Applied Physics (1996), 29(11), 2750-2753.

Cathode

The cathode 209 is selected from materials that have a workfunction allowing injection of electrons into the second light-emitting layer 207 of the OLED. Other factors influence the selection of the cathode such as the possibility of adverse interactions between the cathode and the light-emitting material. The cathode may consist of a single material such as a layer of aluminium. Alternatively, it may comprise a plurality of conductive materials such as metals, for example a bilayer of a low workfunction material and a high workfunction material such as calcium and aluminium, for exampleas disclosed in WO 98/10621. The cathode may comprise elemental barium, for example as disclosed in WO 98/57381, Appl. Phys. Lett. 2002, 81(4), 634 and WO 02/84759. The cathode may comprise a thin, preferably 0.5-5 nm, layer of metal compound, in particular an oxide or fluoride of an alkali or alkali earth metal, between the organic layers of the device and one or more conductive cathode layers to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A formulation suitable for forming the hole-transporting layers 105A, 105B and the light-emitting layer 107 may be formed from the components forming those layers and one or more suitable solvents.

The formulation may be a solution of the components of the layer in question, or may be a dispersion in the one or more solvents in which one or more components are not dissolved. Preferably, the formulation is a solution.

Exemplary solvents include benzenes substituted with one or more substituents selected from $C_{1-10}$ alkyl and $C_{1-10}$ alkoxy groups, for example toluene, xylenes and methylanisoles.

Particularly preferred solution deposition techniques including printing and coating techniques such spin-coating and inkjet printing.

Coating methods are particularly suitable for devices wherein patterning of the light-emitting layer is unnecessary—for example for lighting applications or simple monochrome segmented displays.

Printing methods are particularly suitable for high information content displays, in particular full colour displays. A device may be inkjet printed by providing a patterned layer over the anode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, slot die coating, roll printing and screen printing.

Preferably one or both of the hole-transporting polymers carries crosslinkable groups that are reacted following deposition of the hole-transporting polymer to form a crosslinked hole-transporting layer. The polymer may be crosslinked by thermal treatment or by irradiation, for example UV irradiation. Thermal crosslinking may be at a temperature in the range of about 100-250° C., optionally about 130-200° C. or about 130-180° C.

EXAMPLES

Materials

Partially conjugated polymers (PCPs) and highly conjugated polymers (HCPs) were formed by Suzuki polymerisation as described in WO 00/53656 using monomers illustrated below in the amounts set out in Tables 1 and 2 respectively.

The extent of conjugation of a PCP is lower than that of a HCP. The PCPs contains a conjugation limiting repeat unit that is not present in the HCPs.

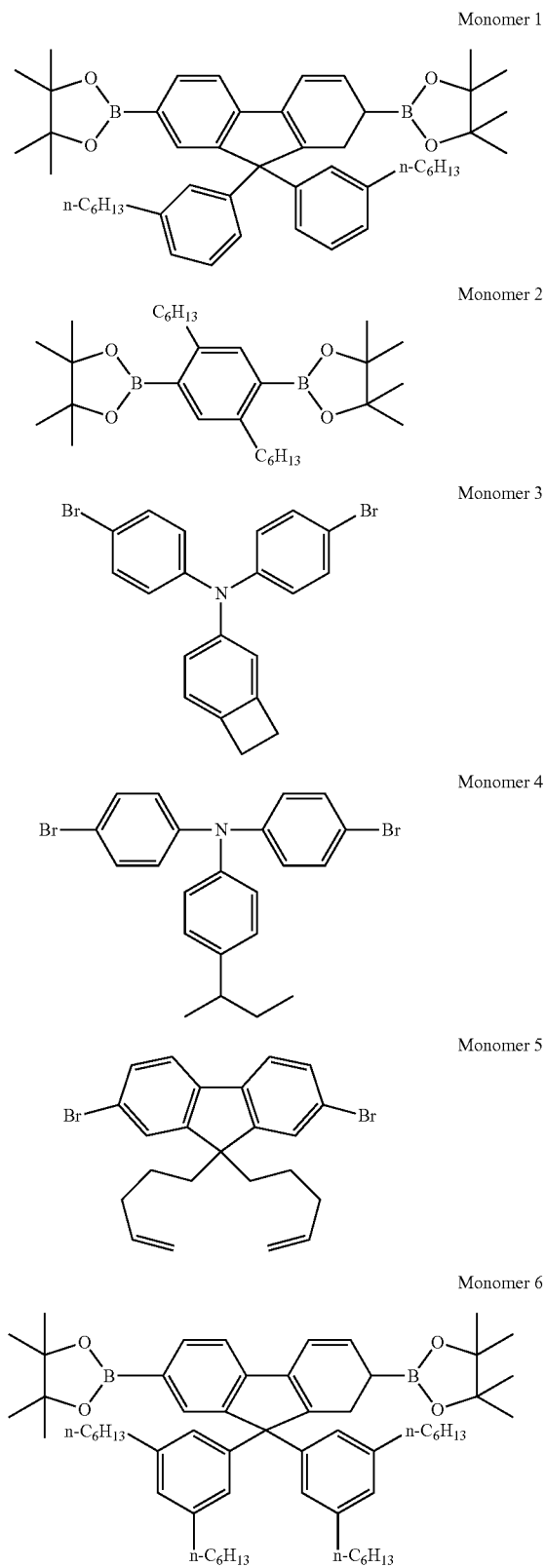

-continued

Monomer 7
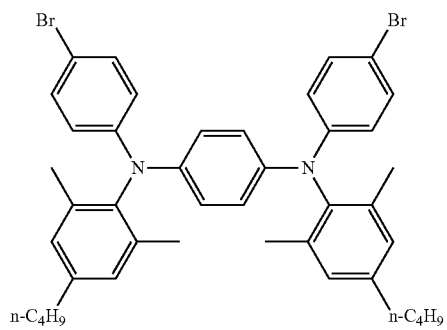

Monomer 8
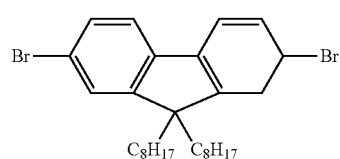

Monomer 9
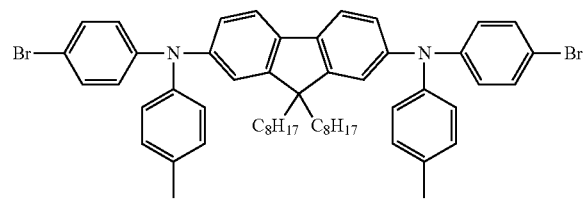

Monomer 10
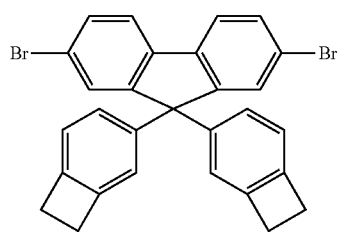

Monomer 11
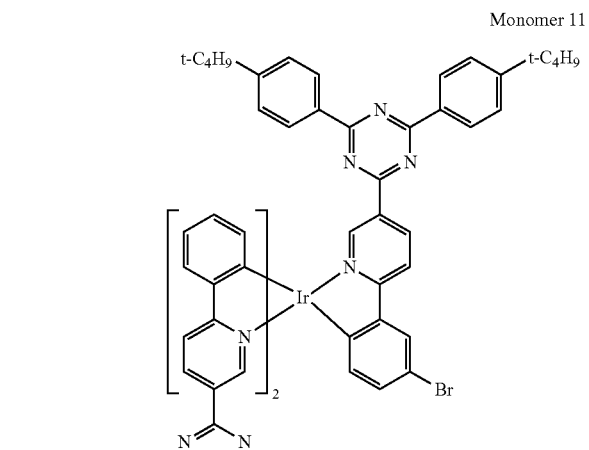

TABLE 1

Highly Conjugated Polymers (HCPs)

| Polymer | Diboronic ester monomer (mol %) | Dibromo monomer (mol %) | S1 energy | HOMO |
|---|---|---|---|---|
| HCP1 | 1 (50) | 3 (7.5), 4 (42.5) | 2.86 eV | 5.27 eV |
| HCP2 | 6 (50) | 3 (7.5), 4 (42.5) | 2.89 eV | 5.41 eV |
| HCP3 | 6 (50) | 7 (30), 8 (12.5), 9 (7.5) | 2.83 eV | 5.11 eV |

TABLE 2

Partially conjugated polymers (PCPs)

| Polymer | Diboronic ester monomer (mol %) | Dibromo monomer (mol %) | Polymer Backbone S1 energy | HOMO |
|---|---|---|---|---|
| PCP1 | 2 (50) | 4 (35), 3 (10), 5 (5) | 3.24 eV | 5.39 eV |
| PCP2 | 2 (50) | 4 (34.95), 3 (10), 5 (5), 11 (0.1) | 3.24 eV* | 5.36 eV |
| PCP3 | 2 (50) | 4 (34.5), 3 (10), 5 (5), 11 (0.5) | 3.24 eV* | 5.39 eV* |
| PCP4 | 2 (50) | 10 (42.5), 3 (7.5) | 3.07 | 5.1 eV |

The PCPs comprise a twisting repeat unit formed from Monomer 2 that limits the conjugation of the PCP.

* Values given are of the polymers without the red-emitting end-capping groups.

Phosphorescent materials of the light-emitting layer were selected from the following monomers:

Red Emitter 1
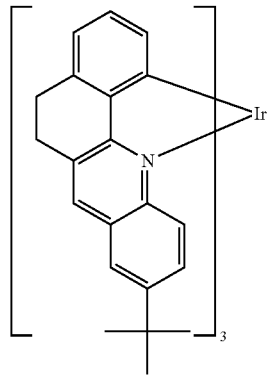

-continued

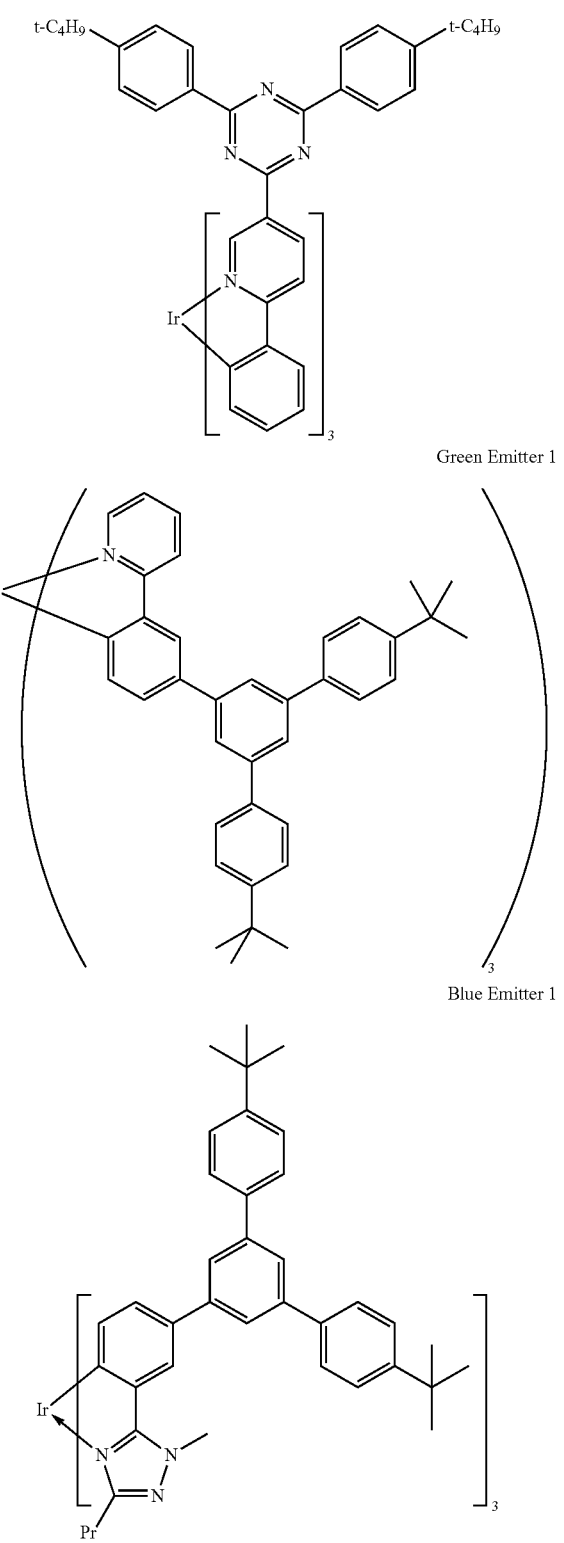

Red Emitter 2

Green Emitter 1

Blue Emitter 1

General Device Process

Organic light-emitting devices having the following structure were prepared:
ITO/HIL/HC-HTL/PC-HTL/LE/Cathode
wherein ITO is an indium-tin oxide anode; HIL is a hole-injecting layer, HC-HTL is a hole-transporting layer formed from a highly conjugated polymer of Table 1; PC-HTL is a hole-transporting layer (which may or may not be emissive when the device is in use) formed from a partially conjugated polymer of Table 2; and LE is a light-emitting layer.

A substrate carrying ITO was cleaned using UV/Ozone. The hole injection layer was formed by spin-coating an aqueous formulation of a hole-injection material available from Plextronics, Inc. A first hole transporting layer was formed to a thickness of about 20 nm by spin-coating a highly conjugated polymer of Table 1 and crosslinking the polymer by heating; a second hole transporting layer was formed to a thickness of about 20 nm by spin-coating a partially conjugated polymer of Table 2 and crosslinking the polymer by heating; and a light-emitting layer was formed to a thickness of about 75 nm by spin-coating a fluorescent or phosphorescent light-emitting composition.

A cathode was formed by evaporation of a first layer of sodium fluoride to a thickness of about 2 nm, a second layer of aluminium of about 100 nm thickness and a third layer of silver of about 100 nm thickness.

Hole-only Device Examples—Effect of Heating

A hole-only device was prepared according to the General Device Process, but without formation of light-emitting layer LE, wherein the first hole-transporting layer was formed by spin-coating and heating HCP1 and, the second hole-transporting layer was formed by spin-coating and heating PCP1 at a thickness of about 75 nm.

Device Example 1B was prepared as for Device Example 1A except that neither hole-transporting polymer was heated following deposition.

Comparative Device 1A was formed as for Device Example 1A except that the first hole-transporting layer was not formed; the second hole-transporting layer formed by spin-coating and heating PCP1 was the only hole-transporting layer.

Comparative Device 1B was formed as for Comparative Device 1A except that the PCP1 was not heated following deposition.

Figure 2:
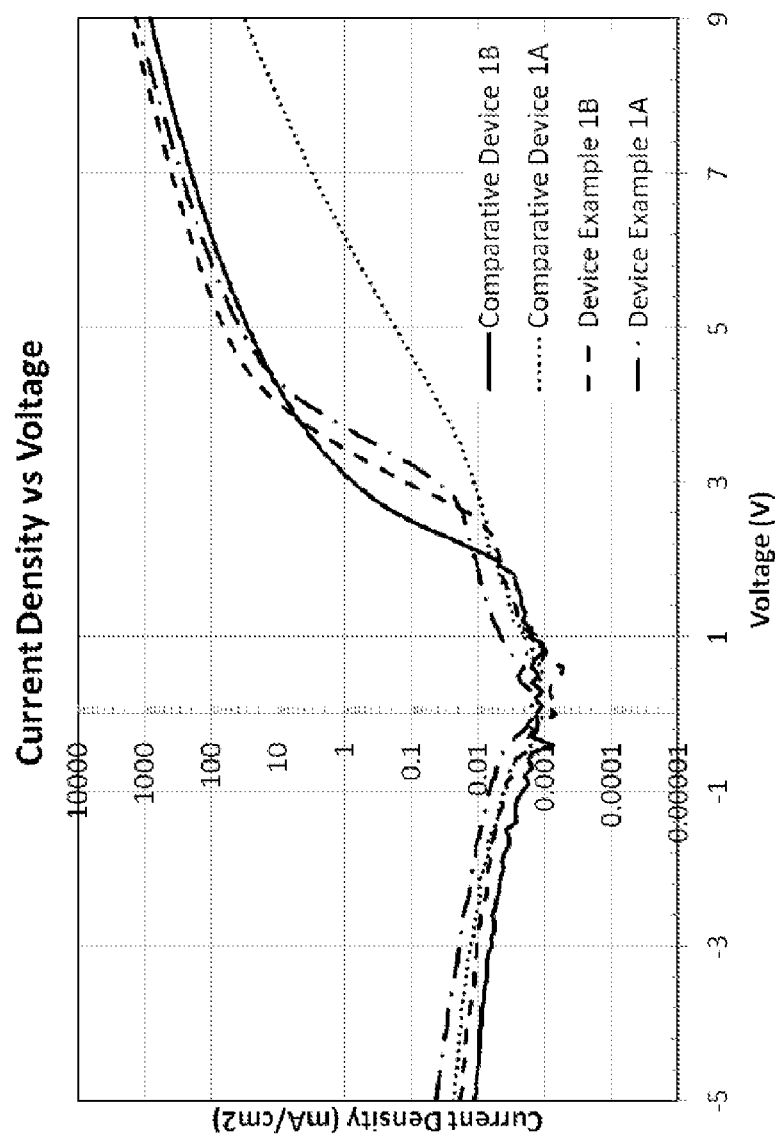
FIG. 2 is a graph of current density vs. voltage for OLEDs according to embodiments of the invention and comparative OLEDs.

With reference to FIG. 2, a comparison of Comparative Devices 1A and 1B shows that current density falls significantly upon heating of the single hole-transporting layer of these devices.

In contrast, current density of Device Example 1A (hole-transporting layers heated) and Device Example 1B (hole-transporting layers not heated) are similar.

Figure 3:
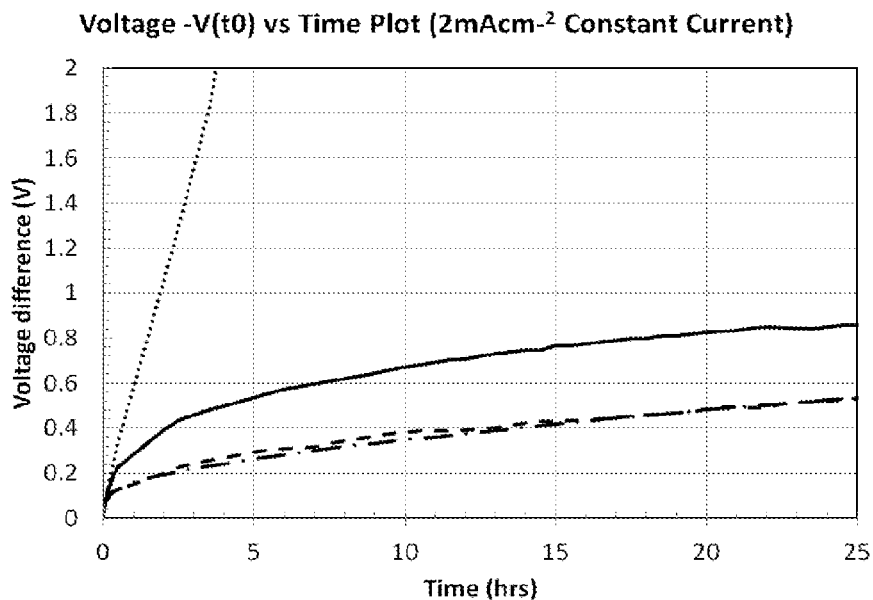
FIG. 3 is a graph of current density vs. voltage for OLEDs according to embodiments of the invention and comparative OLEDs.

With reference to FIG. 3, the voltage at a constant current rises sharply for Comparative Device 1A, in which a single hole-transporting layer is heated, as compared to Comparative Device 1A in which the single hole-transporting layer is not heated.

In contrast, there is little or no difference between Device Example 1A (two hole-transporting layers, both heated) and Device Example 1B (two hole-transporting layers, neither heated).

Without wishing to be bound by any theory, it is believed that undesirable interaction between a hole injection layer and an adjacent hole-transporting layer may occur upon heating to crosslink the hole-transporting layer, and inclusion of a second hole-transporting layer mitigates the effect of this undesirable interaction.

Device Example 2—Fluorescent OLED

Device Example 2 was prepared according to the General Device Process wherein the first hole-transporting layer was formed by spin-coating and heating HCP2, the second hole-transporting layer was formed by spin-coating and heating PCP1 and the light-emitting layer was formed by spin coating a composition of a blue fluorescent light-emitting polymer comprising fluorene (VIIa), an amine repeat unit of formula (III-1) and a repeat unit of formula (III-3), and an additive polymer.

For the purpose of comparison, Comparative Device 2 was prepared as for Device Example 2 except that only one hole-transporting layer, formed by spin-coating and heating PCP1, was formed between the hole-injection layer and the light-emitting layer.

Figure 4:
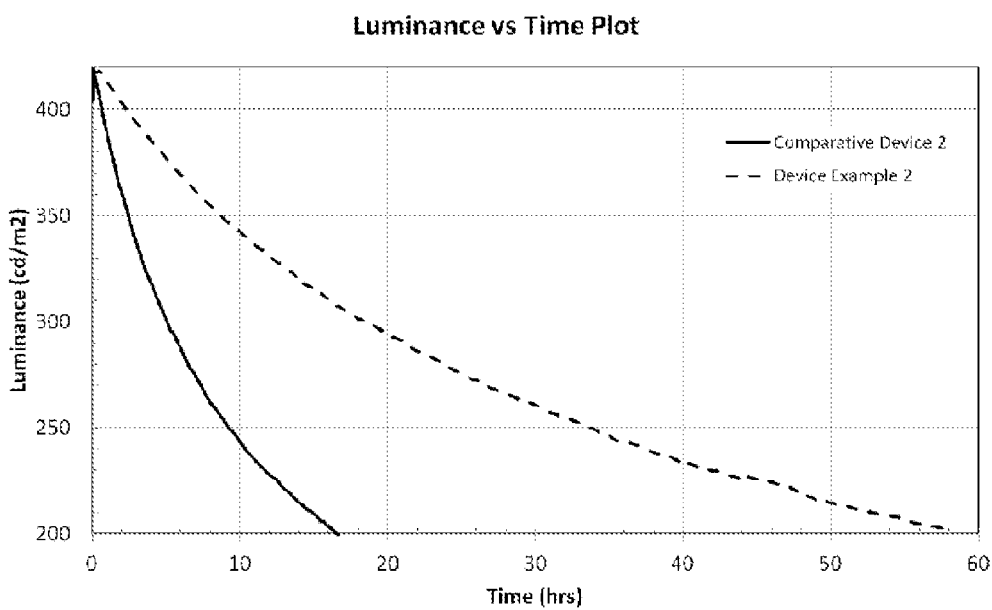
FIG. 4 is a graph of brightness vs. time for a fluorescent blue OLED according to an embodiment of the invention and a comparative device.

With reference to FIG. 4, the time taken for brightness of Device Example 2 to fall to 50% of a starting brightness at constant current is considerably longer than for Comparative Device 2.

Figure 5:
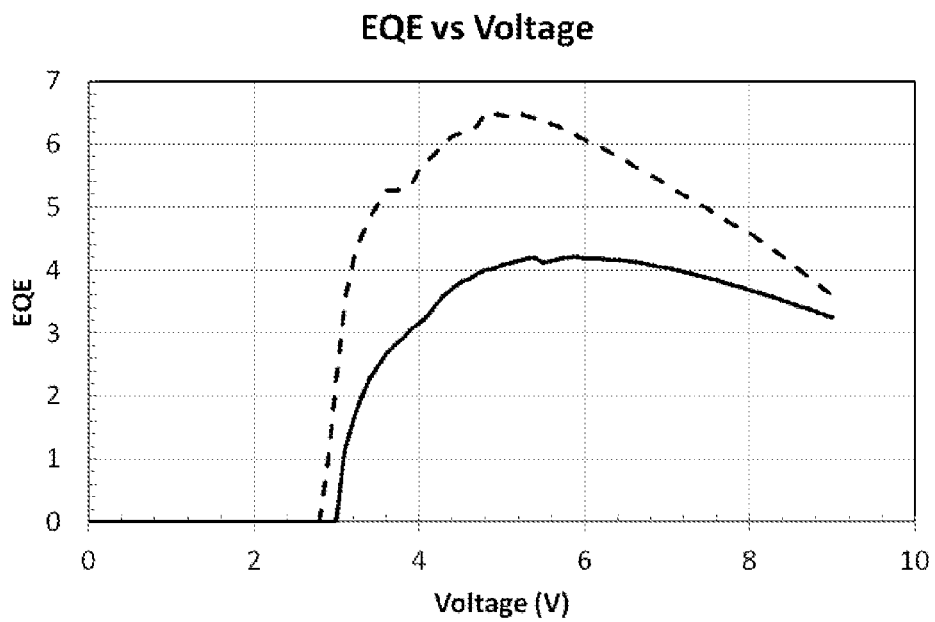
FIG. 5 is a graph of external quantum efficiency vs. voltage for a fluorescent blue OLED according to an embodiment of the invention and a comparative device.

With reference to FIG. 5, Device Example 2 having two hole-transporting layers has a considerably higher external quantum efficiency than Comparative Device 2 having only one hole-transporting layer.

Device Example 3—Fluorescent OLED

Device Example 3 was prepared according to the General Device Process wherein the first hole-transporting layer was formed by spin-coating and heating HCP3, the second hole-transporting layer was formed by spin-coating and heating PCP4 and the light-emitting layer was formed by spin coating a composition of a blue fluorescent light-emitting polymer comprising fluorene (VIIa), an amine repeat unit of formula (III-1) and a repeat unit of formula (III-3), and an additive polymer.

For the purpose of comparison, Comparative Device 3 was prepared as for Device Example 3 except that only one hole-transporting layer, formed by spin-coating and heating PCP4, was formed between the hole-injection layer and the light-emitting layer.

Figure 6:
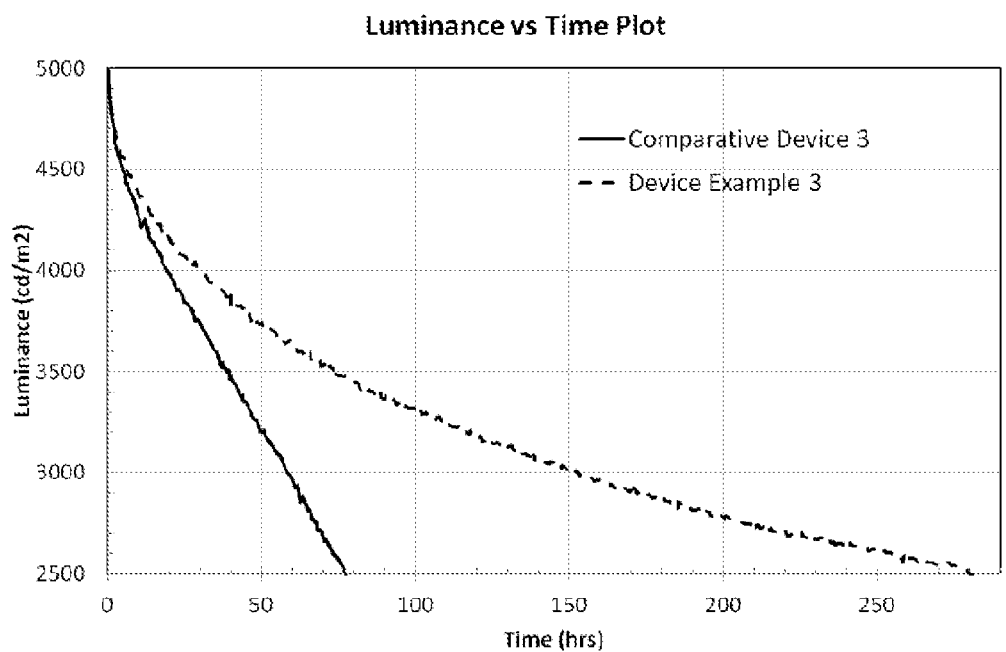
FIG. 6 is a graph of brightness vs. time for a phosphorescent white OLED according to an embodiment of the invention and a comparative device.

With reference to FIG. 6, time taken for brightness of Device Example 3 to fall to 70% of a starting luminance at constant current is more than double that of Comparative Device 3.

Figure 7:
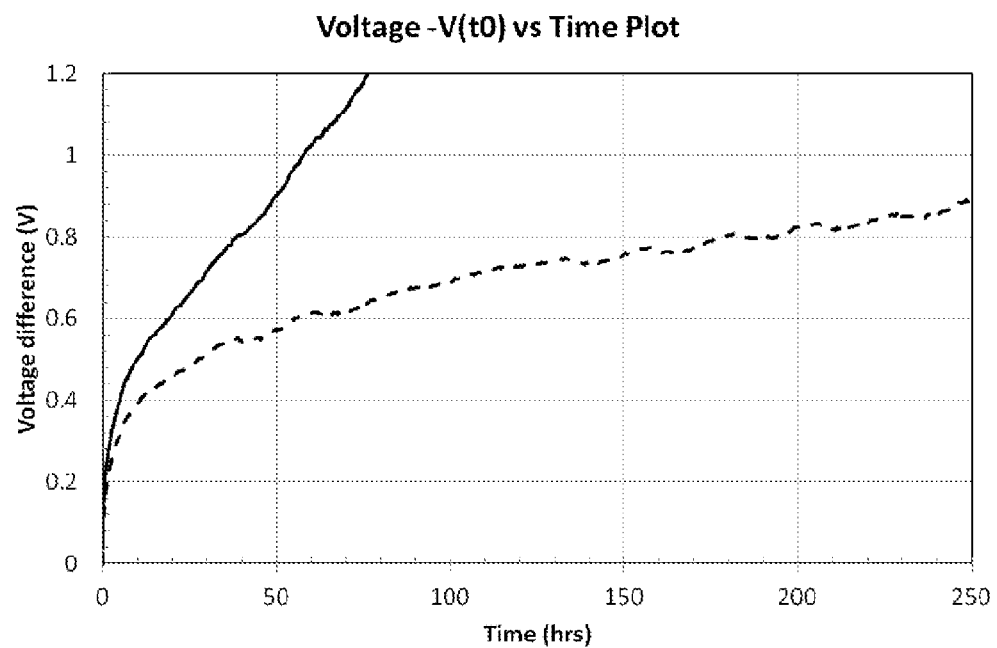
FIG. 7 is a graph of voltage vs. time for a phosphorescent white OLED according to an embodiment of the invention and a comparative device.

With reference to FIG. 7, voltage at a given current rises much more sharply over time for Comparative Device 3 than for Device Example 3.

Without wishing to be bound by any theory, it is believed that the anode of Comparative Device 3 degrades more rapidly than that of Device Example 3.

Device Example 4—Phosphorescent OLEDs

White light-emitting Device Example 4 was prepared according to the General Device Process wherein the first hole-transporting layer was formed by spin-coating and heating HCP1, the second hole-transporting layer was formed by spin-coating and heating PCP3 and the light-emitting layer was formed by spin coating a composition of a host polymer (54 wt %), Green Emitter 1 (1 wt %) and Blue Emitter 1 (45 wt %).

The host polymer was formed by Suzuki polymerisation as described in WO 00/53656 of the following monomers:

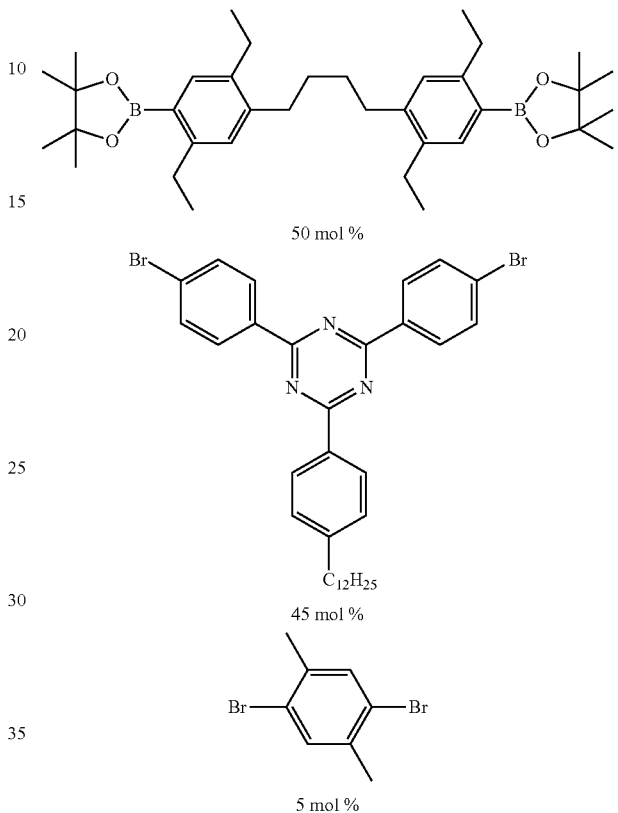

PCP3 contains a red phosphorescent end-capping group. Red emission from the second hole-transporting layer combines with green and blue emission from the light-emitting layer to produce white light.

For the purpose of comparison, Comparative Device 4A was prepared as for Device Example 4 except that only one hole-transporting layer, formed by spin-coating and heating PCP3, was formed between the hole-injection layer and the light-emitting layer.

For the purpose of comparison, Comparative Device 4B was prepared as for Device Example 4 except that only one hole-transporting layer, formed by spin-coating and heating a blend of PCP2 and PCP3, was formed between the hole-injection layer and the light-emitting layer.

Data for these devices are provided in Table 3.

TABLE 3

| Device | CIE X | CIE Y | V at 1 Kcdm$^{-2}$ | EQE at 1 kcdm$^{-2}$ | Lm/W at 1 kcdm$^{-2}$ | T70 at 1 kcdm$^{-2}$ |
|---|---|---|---|---|---|---|
| Comparative Device 4A | 0.471 | 0.427 | 5.27 | 16.7 | 22.7 | 15 |
| Device Example 4 | 0.446 | 0.409 | 4.82 | 16.7 | 24.0 | 11 |
| Comparative Device 4B | 0.447 | 0.420 | 5.22 | 15.6 | 21.7 | 8 |

Although Comparative Device 4A has higher Lm/W efficiency and T70 lifetime, the colour point of this device is significantly greener than that of Device Example 4. Device Example 4 and Comparative Device 4B have similar colour points.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. An organic light-emitting device comprising an anode; a cathode; a light-emitting layer between the anode and the cathode; a first hole-transporting layer comprising a first conjugated hole-transporting polymer between the anode and the light-emitting layer; and a second hole-transporting layer comprising a second conjugated hole-transporting polymer between the first hole-transporting layer and the light-emitting layer, wherein a lowest excited state energy level of the first hole-transporting polymer is lower than the lowest excited state energy of the second hole-transporting polymer; wherein a difference in HOMO level of the first and second hole-transporting polymers is no more than 0.3 eV.

2. An organic light-emitting device according to claim 1 wherein the light-emitting layer comprises a fluorescent light-emitting material and the lowest excited state energy is a lowest singlet excited state energy.

3. An organic light-emitting device according to claim 1 wherein the light-emitting layer comprises a phosphorescent light-emitting material and the lowest excited state energy is a lowest triplet excited state energy.

4. An organic light-emitting device according to claim 1 wherein the first and second hole-transporting polymers each comprise a repeat unit of formula (III):

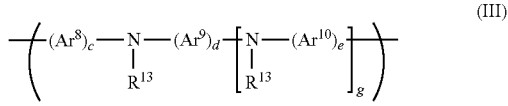

(III)

wherein $Ar^8$, $Ar^9$ and $Ar^{10}$ in each occurrence are independently substituted or unsubstituted aryl or heteroaryl g is 0, 1 or 2; $R^{13}$ is H or a substituent; c, d and e are each independently 1, 2 or 3; and any two aromatic or heteroaromatic groups bound directly to the same N atom may be linked by a direct bond or divalent linking group.

5. An organic light-emitting device according to claim 4 wherein the first and second hole-transporting polymers both comprise a same unit of formula (III).

6. An organic light-emitting device comprising an anode; a cathode; a light-emitting layer between the anode and the cathode; a first hole-transporting layer comprising a first conjugated hole-transporting polymer between the anode and the light-emitting layer; and a second hole-transporting layer comprising a second conjugated hole-transporting polymer between the first hole-transporting layer and the light-emitting layer, wherein a lowest excited state energy level of the first hole-transporting polymer is lower than the lowest excited state energy of the second hole-transporting polymer; wherein at least one of the first and second hole-transporting layers comprises a fluorescent or phosphorescent light-emitting material that emits light when the device is in use.

7. An organic light-emitting device according to claim 6 wherein the second hole-transporting layer comprises the fluorescent or phosphorescent light-emitting material.

8. An organic light-emitting device according to claim 6 wherein the fluorescent or phosphorescent light-emitting material emits a red light when the device is in use.

9. An organic light-emitting device according to claim 1 wherein a hole-injection layer is provided between the anode and the first hole-transporting layer.

10. An organic light-emitting device according to claim 1 wherein each of the first and second hole-transporting layers is crosslinked.

11. An organic light-emitting device according to claim 1 wherein the device emits white light.

* * * * *